(12) United States Patent
Franklin

(10) Patent No.: US 8,884,628 B2
(45) Date of Patent: *Nov. 11, 2014

(54) SYSTEMS, METHODS, AND APPARATUS FOR MONITORING A MACHINE

(75) Inventor: Wesley Donald Franklin, Carson City, NV (US)

(73) Assignee: General Electric Company, Schenectady, NY (US)

(*) Notice: Subject to any disclaimer, the term of this patent is extended or adjusted under 35 U.S.C. 154(b) by 247 days.

This patent is subject to a terminal disclaimer.

(21) Appl. No.: 13/343,821

(22) Filed: Jan. 5, 2012

(65) Prior Publication Data

US 2012/0098552 A1 Apr. 26, 2012

Related U.S. Application Data

(63) Continuation of application No. 12/417,996, filed on Apr. 3, 2009, now Pat. No. 8,115,494.

(51) Int. Cl.
*G01R 31/08* (2006.01)
*G01R 27/26* (2006.01)
*G01R 31/34* (2006.01)

(52) U.S. Cl.
CPC .............. *G01R 31/343* (2013.01); *G01R 31/08* (2013.01); *G01R 27/26* (2013.01)
USPC ...... 324/522; 324/765.01; 324/545; 324/661; 324/662; 324/679; 73/660; 73/597; 73/116.03; 73/116.04; 702/183; 415/118

(58) Field of Classification Search
CPC ....... G01R 31/08; G01R 27/26; G01R 31/343
USPC ................... 324/765.01, 545, 661, 662, 679; 73/660, 597, 116.03, 116.04; 702/183; 415/118

See application file for complete search history.

(56) References Cited

U.S. PATENT DOCUMENTS

| | | | | |
|---|---|---|---|---|
| 3,428,838 A | * | 2/1969 | Gibbs et al. | 310/56 |
| 4,335,600 A | | 6/1982 | Wu et al. | |
| 4,502,046 A | * | 2/1985 | Wonn et al. | 340/682 |
| 4,518,917 A | | 5/1985 | Oates et al. | |
| 4,543,830 A | | 10/1985 | Stephens | |
| 4,563,675 A | * | 1/1986 | Miller et al. | 340/679 |
| 4,644,270 A | * | 2/1987 | Oates et al. | 324/207.25 |
| 5,101,165 A | | 3/1992 | Rickards | |
| 5,119,036 A | | 6/1992 | Rickards et al. | |
| 5,126,677 A | * | 6/1992 | Campbell et al. | 324/511 |

(Continued)

OTHER PUBLICATIONS

Deulin et al., "A New Technique for Diagnostics of Rubbing Machine Elements", IEEE International Conference on Industrial Technology, 2009, p. 1-3.*

(Continued)

*Primary Examiner* — Patrick Assouad
*Assistant Examiner* — Lamarr Brown
(74) *Attorney, Agent, or Firm* — Fletcher Yoder, P.C.

(57) ABSTRACT

Systems, methods and apparatus for monitoring rub detection in a machine are provided. An electrical signal may be provided for transmission to and into a component of the machine. A capacitance associated with the electrical signal in the component may be monitored. Based at least in part upon a determined change in the monitored capacitance, a potential rub condition for the component of the machine.

18 Claims, 4 Drawing Sheets

(56) References Cited

U.S. PATENT DOCUMENTS

| | | | |
|---|---|---|---|
| 5,159,563 A | 10/1992 | Miller et al. | |
| 5,519,300 A * | 5/1996 | Leon et al. | 318/729 |
| 5,521,482 A * | 5/1996 | Lang et al. | 318/800 |
| 5,748,005 A | 5/1998 | McCormick et al. | |
| 5,814,998 A | 9/1998 | Gruenewald et al. | |
| 5,936,410 A * | 8/1999 | Dunfield et al. | 324/662 |
| 6,035,265 A * | 3/2000 | Dister et al. | 702/183 |
| 6,799,125 B2 | 9/2004 | Lau et al. | |
| 6,832,407 B2 | 12/2004 | Salem et al. | |
| 6,912,484 B2 | 6/2005 | Bibelhausen et al. | |
| 6,949,922 B2 | 9/2005 | Twerdochlib et al. | |
| 7,117,744 B2 * | 10/2006 | Hobelsberger et al. | 73/660 |
| 7,259,552 B2 | 8/2007 | Twerdochlib | |
| 7,322,788 B2 | 1/2008 | Shindo et al. | |
| 7,658,588 B1 | 2/2010 | Schopf et al. | |
| 7,852,092 B2 | 12/2010 | Andarawis et al. | |
| 7,853,427 B2 | 12/2010 | Chan et al. | |
| 8,110,767 B2 * | 2/2012 | Yamauchi et al. | 200/600 |
| 8,115,494 B2 * | 2/2012 | Franklin | 324/522 |
| 8,344,741 B2 * | 1/2013 | Sheikman et al. | 324/686 |
| 2002/0042965 A1 | 4/2002 | Salem et al. | |
| 2003/0222640 A1 | 12/2003 | Twerdochlib et al. | |
| 2005/0114082 A1 | 5/2005 | Kant et al. | |
| 2005/0218887 A1 | 10/2005 | Twerdochlib | |
| 2008/0240902 A1 | 10/2008 | Cooper | |
| 2008/0295604 A1 * | 12/2008 | Hoyte et al. | 73/760 |
| 2009/0003991 A1 * | 1/2009 | Andarawis et al. | 415/118 |
| 2009/0128166 A1 * | 5/2009 | Webster | 324/662 |
| 2009/0142194 A1 | 6/2009 | Draper et al. | |
| 2009/0243585 A1 * | 10/2009 | Andarawis et al. | 324/71.2 |
| 2009/0281766 A1 * | 11/2009 | Chan et al. | 702/158 |
| 2010/0005903 A1 | 1/2010 | Beavis | |
| 2010/0114810 A1 | 5/2010 | Hoyte et al. | |

OTHER PUBLICATIONS

Ling et al., "Analysis of Rotor Rubbing Fault signal Based on Hilbert-Huang Transform", 2009 International Conference on Measuring Technology and Mechatronics Automation, p. 586-589.*

Zhou et al., "Insulation Condition Monitoring and Testing for Large Electrical Machines", IEEE International Symposium on Electrical Insulation, 1996, p. 239-242.*

* cited by examiner

SYSTEMS, METHODS, AND APPARATUS FOR MONITORING A MACHINE

CROSS-REFERENCE TO RELATED APPLICATION

This application is a continuation of co-pending U.S. patent application Ser. No. 12/417,996, entitled "Systems, Methods, and Apparatus for Rub Detection in a Machine," which was filed on Apr. 3, 2009, and is incorporated herein by reference.

TECHNICAL FIELD

Embodiments of the invention relate generally to machines, and more specifically, to rub detection in a machine.

BACKGROUND

Many machines, such as turbines, have a centrally disposed rotating portion that rotates within a stationary portion, casing or shell. In turbines for example, a typical problem known as "rubbing" arises when a rotating portion of the turbine, such as a rotor, comes into contact with another component of the turbine, such as the stationary caging, when the components are not in contact with each other under normal circumstances. Rubbing often gives rise to unwanted and potentially dangerous conditions in rotating machinery. For example, one of the harmful effects of rubbing can be witnessed in steam turbines. Typically, steam turbines include a rotor with rows of turbine blades that rotate between rows of stator blades. The tips of the turbine blades are adjacent to an inside surface of the casing for the turbine. During normal operation, the tips of the turbine blades do not rub against the casing. However, a slight deformity in the turbine casing, rotor shaft, inner casing or any other component can cause the turbine blades to rub against the stationary casing of the turbine. Rubbing between the turbine blades and the stationary component in a steam turbine can damage the turbine components, while increasing the clearance between the turbine blades and the stationary casing to prevent rubbing can reduce the efficiency of the flow through the steam turbine.

Rubbing may occur due to an unbalance in the rotor, thus giving rise to abnormal vibrations in the turbine. In conventional turbines, a plurality of vibration sensors may be mounted at various points on the turbine system to monitor signature vibrations indicative of rubbing. Other techniques for monitoring rubbing may include the use of particular sensors for detecting the occurrence of acoustic emissions within the metal parts of the turbine, such acoustic emissions being generated as a result of certain abnormal operating conditions in the turbine. Such conventional techniques, however, have often proved to be inaccurate as it is extremely difficult to distinguish between the vibrations caused by rubbing and the vibrations caused by the turbine itself. More specifically, the vibrations detected by the sensors usually include the vibrations resulting from the various components of the turbine itself.

Accordingly, there is a need for methods, systems and apparatus for detection of rubbing in machines.

BRIEF DESCRIPTION

According to one embodiment of the invention, there is disclosed a method for monitoring a machine. The method may include providing an electrical signal for transmission to a component of the machine, such as a rotating component of a turbine. A capacitance associated with the electrical signal may be monitored, and a change in the monitored capacitance may be determined. A potential rub condition for the component of the machine may be detected based at least in part on the determined change in the monitored capacitance.

According to another embodiment of the invention, there is disclosed a system for monitoring a machine. The system may include a signal generator, one or more detection devices, and at least one processor. The signal generator may be configured to provide an electrical signal that is transmitted to at least one component of the machine, such as a rotating component in a turbine. The one or more detection devices may be configured to detect a capacitance associated with the electrical signal in the at least one component of the machine. The at least one processor may be configured to compare the monitored capacitance to at least one expected value; and detect, based at least in part on the comparison, the occurrence of a potential rub condition for the component.

According to yet another embodiment of the invention, a method for monitoring a machine is disclosed. An alternating current voltage signal may be transmitted to at least one component of the machine, such as a rotating component in a turbine. A capacitance associated with the signal may be monitored, and the determined capacitance may be compared to an at least one expected value. Based at least in part on the comparison, the occurrence of a potential rub condition between the at least one machine component and another component of the machine may be detected.

Other embodiments, aspects, and features of the invention will become apparent to those skilled in the art from the following detailed description, the accompanying drawings, and the appended claims.

BRIEF DESCRIPTION OF THE DRAWINGS

Figure 1:
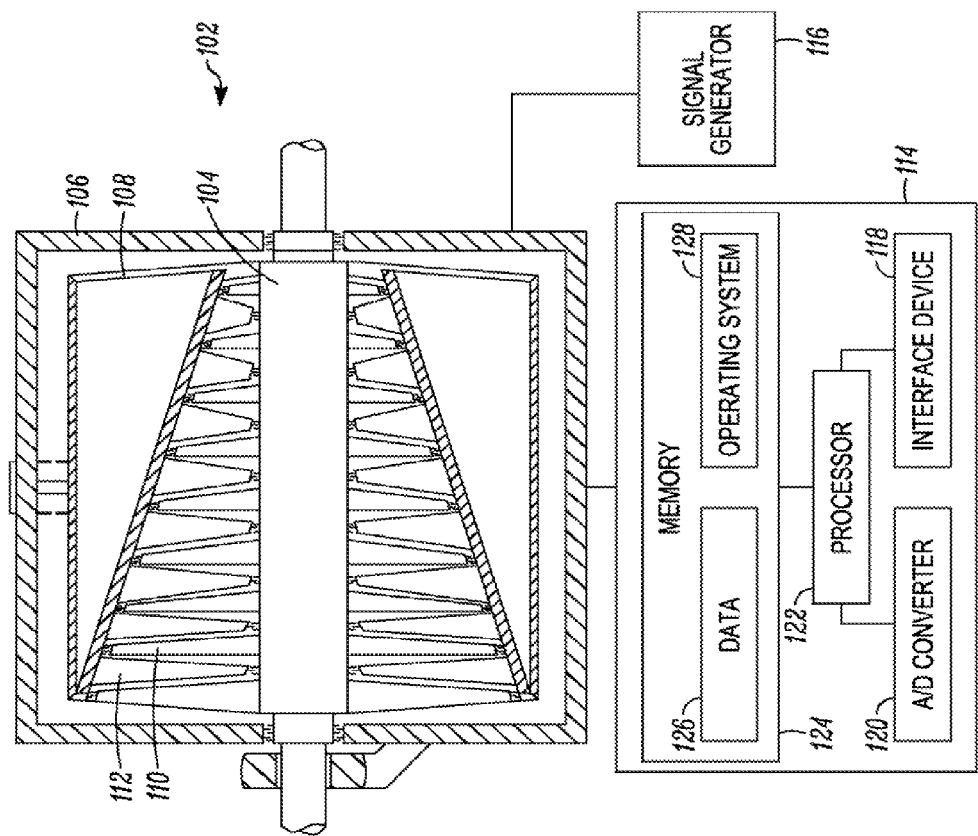

Having thus described the invention in general terms, reference will now be made to the accompanying drawings, which are not necessarily drawn to scale, and wherein:

FIG. 1 is a schematic view of one example system for monitoring a machine, according to an illustrative embodiment of the invention.

Figure 2:
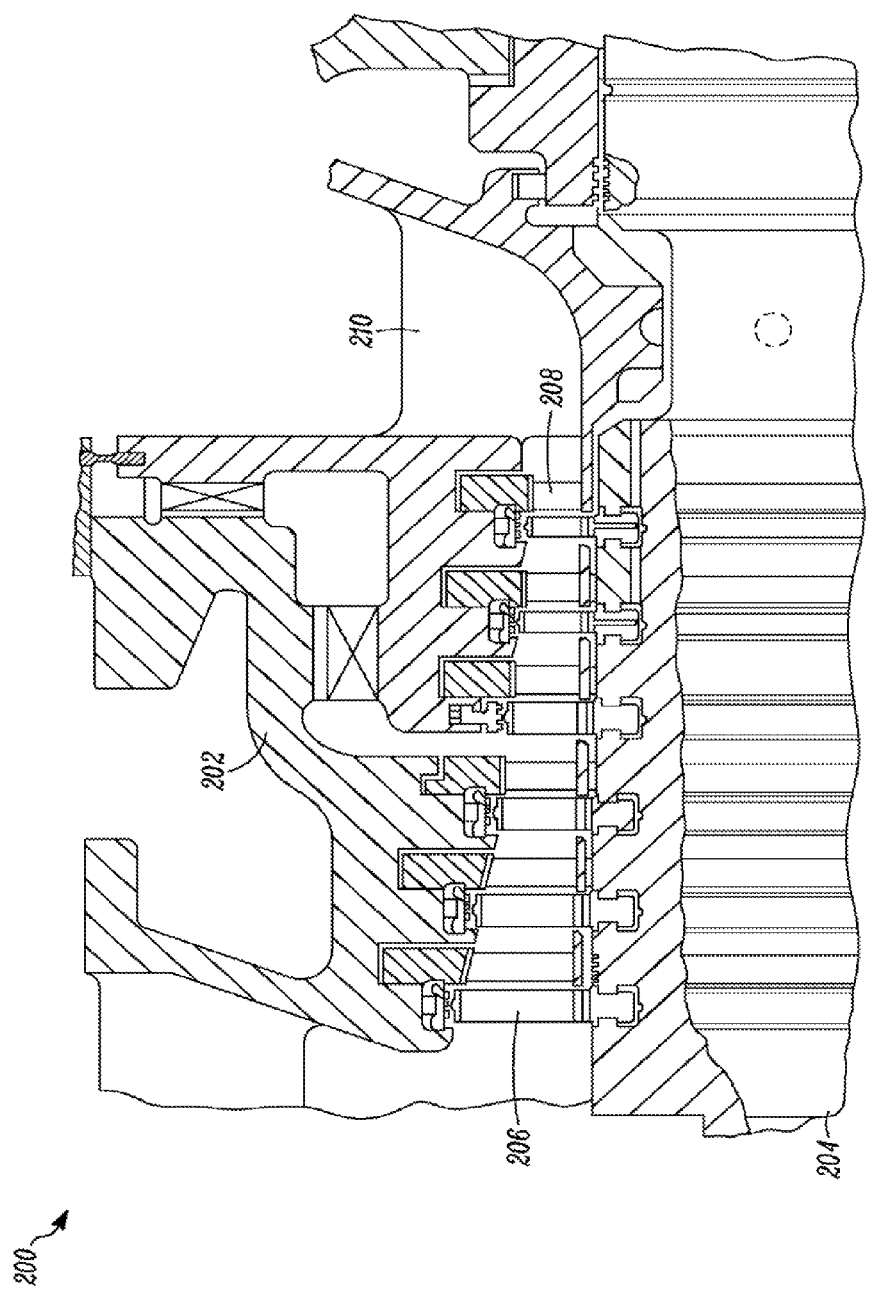

FIG. 2 is a magnified cross-sectional side view of a portion of a turbine that may be monitored in accordance with various embodiments of the invention.

Figure 3:
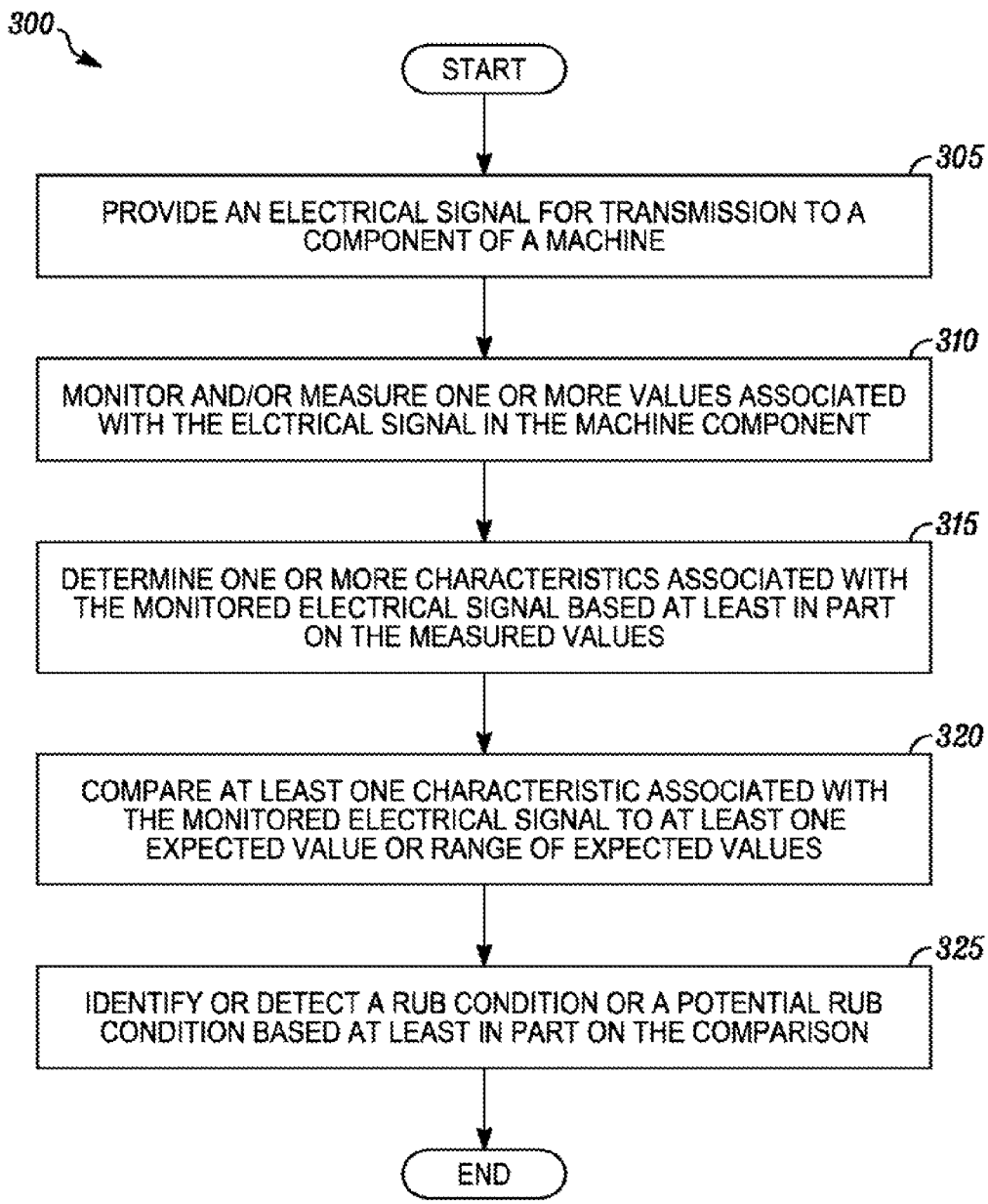

FIG. 3 is a flowchart illustrating one example method for monitoring a machine, according to an illustrative embodiment of the invention.

Figure 4:
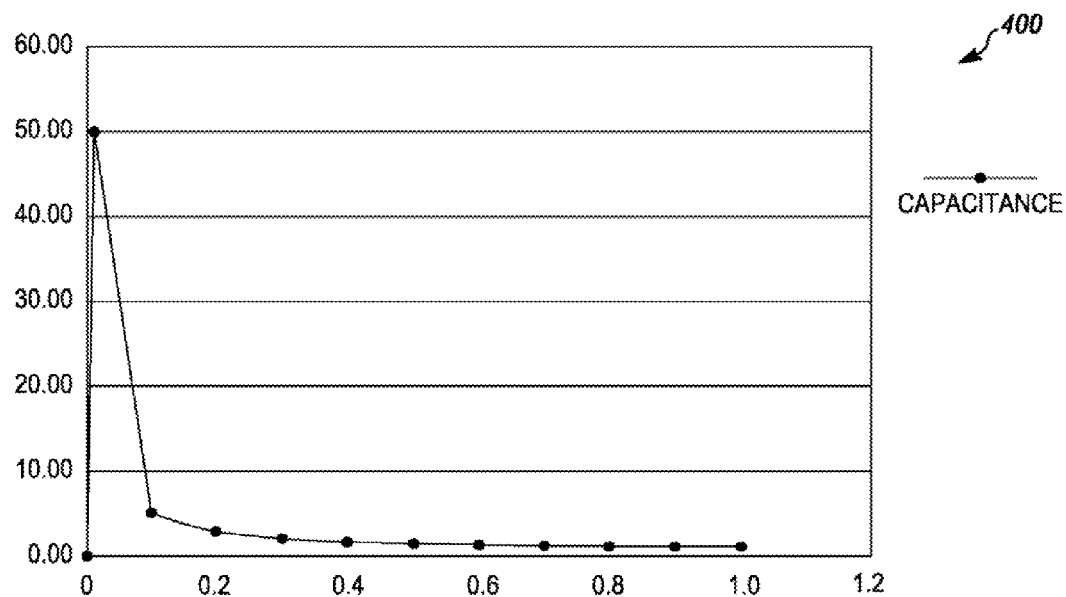

FIG. 4 is a diagram illustrating one example of a change in the capacitance associated with a rotating component of a turbine during a potential rub condition and a rub condition, in accordance with an embodiment of the invention.

Figure 5:
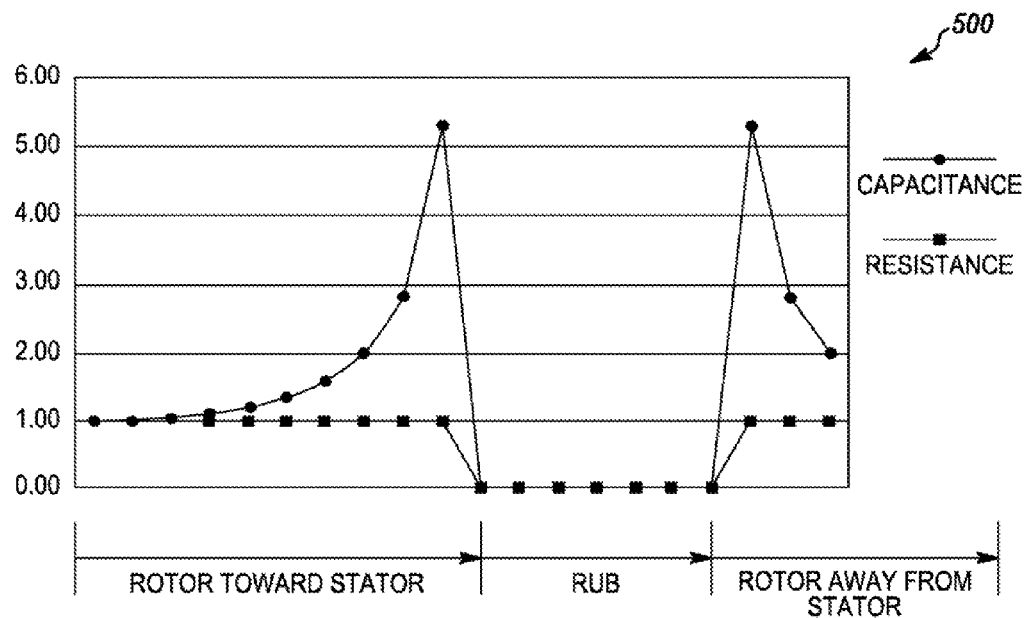

FIG. 5 is a diagram illustrating one example of a change in the resistance and capacitance associated with a rotating component of a turbine during a potential rub condition and a rub condition, in accordance with an embodiment of the invention.

DETAILED DESCRIPTION

Illustrative embodiments of the invention now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like numbers refer to like elements throughout.

Disclosed are systems, methods and apparatus for detection of rubbing and/or potential rubbing between machine components. One example of a machine that may be monitored by certain embodiments of the invention is a turbine with at least one rotating component and stationary component; however, other embodiments of the invention may be utilized to monitor other types of machines including components which may come in contact with each other. A signal generator may generate an electrical signal that is provided to the at least one component, such as the rotating component of the turbine. The electrical signal may be monitored on the rotating component and/or one or more measurements associated with the electrical signal may be made. One or more characteristics associated with the monitored electrical signal may be determined or identified based at least in part on the monitored and/or measured values. For example, an impedance associated with the electrical signal may be measured and/or determined in real time or near real time. The one or more characteristics may be compared to one or more expected values and/or ranges of expected values. For example, the determined impedance may be compared to an expected value or range of values for the impedance. Based at least in part on the comparison, a rub or a potential rub condition between the rotating component and another component of the turbine may be identified.

FIG. 1 is a schematic view of one example system 100 for monitoring a turbine 102, according to an illustrative embodiment of the invention. The example system 100 may be used for monitoring components of any type of machine; the turbine 102 shown in FIG. 1 being one example of a machine which may be monitored. In FIG. 1, a cross-sectional view of an example steam turbine 102 which may be used in a variety of applications, for example, power generation applications, is illustrated. Although a steam turbine is illustrated, embodiments of the invention may be utilized in association with a wide variety of different turbines and/or types of turbines, including but not limited to, steam turbines, gas turbines, etc.

The steam turbine 102 may include a rotating component, such as a rotor 104, enclosed in a stationary component with multiple turbine casings, such as an outer turbine casing 106 and an inner turbine casing 108. A plurality of rotating turbine blades 110 may be mounted on the rotor 104, and may extend radially towards the inner turbine casing 108. These rotating turbine blades may be placed between adjacent rows of stationary stator blades 112, which extend radially inward from the inner turbine casing 108 and towards the rotor 104. During normal operation of the steam turbine 102, steam enters the turbine 102 from a boiler through at least one inlet nozzle and expands as the steam passes through the rotating turbine blades 110 and the stationary stator blades 112. However, lateral vibration of the rotor 104 during the operation of the steam turbine 102 may lead to rubbing between the tips of the rotating turbine blades 110 mounted on the rotor 104, and one or more other components of the turbine 102, such as the inner turbine casing 108. Thus, at least one detection device 114 (herein after referred to as rub detection unit 114) operable to detect a rub condition or a potential rub condition between the rotor 104 and the inner turbine casing 108 may be utilized in association with the steam turbine 102.

Further, as shown in FIG. 1, the system 100 may include a suitable signal generator 116 in communication with the steam turbine 102. For example, a signal generator 116 may be mounted on the outer surface of the turbine section 110 of the steam turbine 102. As another example, the signal generator 116 may be situated remotely to the steam turbine 102. The signal generator 116 may provide an electrical signal to one or more rotating components of the steam turbine 102. Examples of the signal generator 116 may include a voltage source, current source, function generator, frequency generator, waveform generator and the like.

Additionally, as shown in FIG. 1, a rub detection unit 114 in communication with or otherwise associated with the steam turbine 102 may be provided. The rub detection unit 114 may be a processor driven device that facilitates the detection of rub conditions and/or potential rub conditions. The rub detection unit 114 may facilitate monitoring of the electrical signal on the one or more rotating components. The rub detection unit 114 may determine one or more characteristics associated with the monitored electrical signal and, based at least in part on a comparison of the one or more characteristics to one or more respective expected values and/or ranges of expected values, the rub detection unit 114 may detect a rub condition or a potential rub condition. In certain embodiments, the rub detection unit 114 may be in communication with one or more suitable sensors or sensing devices that measure the electrical signal on one or more rotating components. Examples of suitable sensors or sensing devices include, but are not limited to, voltage sensors, current sensors, etc.

As shown in FIG. 1, the rub detection unit 114 may include one or more interface devices 118, such as, network ports, etc. that facilitate receiving data in the form of electrical signals. These one or more interface devices may facilitate the receipt of measurements associated with the electrical signal on the one or more rotating components. Additionally or alternatively, the rub detection unit 114 may include one or more suitable analog to digital (A/D) converters 120 that facilitate the receipt of analog measurements data associated with the electrical signal and the conversion of the analog data into digital data that may then be processed at a processor 122. The A/D converters 120 may also facilitate the conversion of any analog signals that are received through the one or more interface devices 118 as desired in various embodiments of the invention. The rub detection unit 114 may also include a memory 124 in communication with the processor 122. The memory 124 may facilitate storage of data 126, such as one or more of the characteristics associated with the monitored electrical signal. The memory 124 may also include programmable logic and/or software components that may be executed by the processor 122, such as, an operating system 128.

FIG. 2 is a magnified cross-sectional side view of a portion of a turbine 200 that may be monitored in accordance with various embodiments of the invention. A cross-sectional view of a steam turbine 200 is shown in FIG. 2; however, embodiments of the invention may be utilized in association with a wide variety of different turbines and types of turbines. The steam turbine 200 may include an expansion stage which may be enclosed inside a stationary assembly, such as a housing 202, which may surround a rotating assembly, such as a rotor 204. A plurality of rotating turbine blades 206 may be mounted on the rotor 204, and may extend radially towards an inner surface of the housing 202. Additionally, a row of stationary stator blades 208 fastened to the housing 202 may be placed between and adjacent to rows of the plurality of rotating turbine blades 206. The rotating turbine blades 206 and the stationary stator blades 208 may be preceded by a steam inlet path 210 through which steam from a boiler (not shown in figure) may enter the steam turbine 200.

The expansion stage contained inside the housing 202 may define an annular path for the hot gases coming from the boiler and entering through the steam inlet path 210. The hot gases coming through the steam inlet path 210 may rotate the plurality of rotating turbine blades 206. Tips of the plurality of rotating turbine blades 206 may rotate in an approximately circular path that is adjacent to the inner surface of the housing 202. As the plurality of rotating turbine blades 206 rotate, contact between the tips of the plurality of rotating turbine blades 206 and the inner surface of the housing 202 may occur as a result of the lateral vibration of the rotating component. This contact, or rubbing, in the turbine 200 may be caused by a wide variety of factors and/or combination of factors, for example, rotor imbalance, misalignment of turbine components, etc.

In various embodiments of the invention, a rub detection unit, such as rub detection unit 114 shown in FIG. 1, may be in communication with a turbine, such as turbine 102 or turbine 200. The rub detection unit 114 may be operable to detect rubbing between one or more rotating components of the turbine 102, such as rotating turbine blades 110 or rotating turbine blades 206, and one or more other components of the turbine 102, such as inner housing 108 or inner housing 202. The signal generator 116 (shown in FIG. 1) and the nib detection unit 114 may work in conjunction with one another to detect a rub condition or a potential rub condition in a turbine 102. The signal generator 116 may transmit or otherwise communicate an electrical signal, such as an alternating current (AC) voltage signal, to a rotating component of the steam turbine 102, for example, to a rotor of the steam turbine 102. A wide variety of signals may be communicated as desired in various embodiments of the invention. In one example embodiment, an AC voltage signal may be communicated with an amplitude of approximately one volt to approximately two volts and a frequency between approximately one kilohertz and approximately 50 kilohertz.

The rub detection unit 114 may receive measurements associated with the electrical signal provided to the rotor through the interface device(s) 118 and/or through the A/D converters 120. The A/D converters 120 may convert incoming analog electrical signals to digital electrical signals and the digital electrical signals may be communicated to the processor 122. The processor 122 may be operable to determine one or more characteristics associated with the electrical signal provided to the turbine and monitored. The determination of the one or more characteristics may be based on the received measurements data. An operating system 128 included in the memory 124 may facilitate the execution of any number of software components associated with the rub detection unit 114. In addition to the operating system, the memory 124 may also store data 126, including measurements data received, determined, and/or calculated by the processor and/or expected values and/or a range of expected values for the one or more characteristics determined by the processor 122. In various embodiments, the values of the one or more characteristics determined by the processor 122 and/or stored in the data 126 may be impedance values, resistance values, and/or capacitance values. The processor 122 may utilize the operating system 128 in comparing the values of the one or more characteristics to the respective expected values, or ranges of expected values, and in doing so may utilize the data 126. For example, the one or more characteristics may relate to impedance, resistance, and/or capacitance. The processor may utilize the operating system 128 in comparing determined values of impedance, resistance and/or capacitance to respective expected values, or ranges of expected values stored in the data 126. Based at least in part on the comparison, a rub or a potential rub condition between the rotating component and another component of the turbine may be determined or identified. Further, a severity associated with a detected rub condition may be determined based at least in part on a length of time for which the calculated values of the one or more characteristics fall outside the expected range of values.

FIG. 3 is a flowchart illustrating one example method 300 for monitoring a machine, such as a turbine, according to an illustrative embodiment of the invention. The method 300 may be used for monitoring at least one component in any type of machine, and may not be limited to monitoring a rotating component in a steam turbine. The method 300 may begin at block 305. At block 305, an electrical signal may be provided to at least one component of a machine, such as a rotating component of a turbine 102 shown in FIG. 1. One example of a signal that may be provided is an alternating current (AC) voltage signal. A wide variety of different signals may be provided as desired in various embodiments of the invention, for example, an AC voltage signal with an amplitude of approximately one volt to approximately two volts. A signal generator 116, for example, a waveform generator, a frequency generator or a function generator may be used for generating the electrical signal provided to the at least one component of the machine. A wide variety of signals with different characteristics may be provided as desired in various embodiments of the invention. For example, the provided signal may be a voltage signal with a frequency of approximately one kilohertz to approximately 50 kilohertz. Following the transmission of the electrical signal to the at least one machine component at block 305, operations may proceed to block 310.

At block 310, the electrical signal provided to the at least one machine component may be monitored and/or one or more values associated with the electrical signal may be measured. The one or more monitored values of the electrical signal provided to the at least one component of the machine may be measured by any suitable number of sensors or sensing devices, for example, voltage sensors, current sensors, etc. Additionally, according to an aspect of the invention, the electrical signal may be monitored in real time or near real time during the operation of the machine. The electrical signal provided to the component of the machine may be an AC voltage signal or an AC current signal for example. In one example embodiment of the invention, the one or more measured values may be communicated to a rub detection unit, such as nib detection unit 114 shown in FIG. 1. The one or more measured values may be communicated to the rub detection unit in real time or near real time. Following the monitoring and/or measuring of the provided electrical signal at block 310, operations may continue at block 315.

At block 315, one or more characteristics associated with the monitored and/or measured electrical signal may be determined based at least in part on the measured values. In one example embodiment, the measured values of the electrical signal communicated to the rub detection component 114 at block 310 may be processed by one or more suitable processors, such as processor 122 shown in FIG. 1. The processor 122 may be operable to determine one or more characteristics associated with the measured values of the electrical signal. Examples of one or more characteristics that may be determined are an impedance that is present on the component of the machine or a capacitance associated with the component of the machine. As one example, the impedance of the monitored signal may be determined by taking the ratio of the voltage of the AC signal to the current of the AC signal. For example, a ratio may be determined for a measured voltage of the signal with respect to a known current for the signal. The calculated impedance may have a real part and an imaginary part. The real part of the impedance may indicate the resistance, while the imaginary part may indicate the capacitance. The processor 122 may be further operable to calculate resistance values and/or capacitance values as desired. Alternatively, in an example embodiment, an oscilloscope may be coupled to the processor 122, and may be operable to calculate impedance, resistance and/or capacitance values as desired. One or more of the characteristics may be determined to detect a rub condition and/or a potential rub condition of the machine component. Following the determination of the one or more characteristics associated with the measured values of the electric signal, at block 315, operations may continue at block 320.

At block 320, at least one of the one or more characteristics may be compared to one or more expected values and/or one or more ranges of expected values. In one example embodiment, a suitable memory device associated with the rub detection unit 114, such as memory 124 shown in FIG. 1, may include data 126 containing expected values and/or ranges of expected values for the one or more characteristics. For example, expected impedance values or ranges of expected impedance values may be stored in the memory 124. As another example, expected capacitance values and/or ranges of expected capacitance values may be stored in the memory 124. The processor 122 may perform a comparison between the calculated values of the one or more characteristics to the expected values or ranges of expected values stored in the memory 124. Following the comparing of the calculated values of the one or more characteristics to the expected values or range of expected values at block 320, operations may continue at block 325.

At block 325, a rub condition or a potential rub condition may be identified or detected based at least in part on the comparison at block 320. Following the comparison between the calculated values of the one or more characteristics and the expected values or the range of expected values by the processor 122, a rub condition or a potential rub condition may be identified depending on which characteristic associated with the electric signal is monitored and subsequently compared. Further, in some embodiments of the invention, the severity associated with the detected rub condition may be determined based at least in part on a length of time for which the calculated values of characteristic associated with the electric signal falls outside an expected range of characteristic values. In one example embodiment, if the impedance values calculated by the processor 122 at block 315 exceed a corresponding expected value, a rub condition may be identified. Further, severity associated with the detected rub condition may be determined based at least in part on a length of time for which the calculated impedance values exceed the expected values. In another example embodiment, if the resistance values calculated by the processor 122 or otherwise at block 315 approaches a near zero value or a value that is relatively low with respect to an expected value, a rub condition may be identified. Further, the severity associated with the detected rub condition may be determined based at least in part on a length of time for which the calculated resistance values approach near zero values. As another example, a potential rub condition may be identified if the capacitance values calculated by the processor 122 or otherwise at block 315, exceed an expected value or a range of expected values. The determined capacitance may increase as a component of the machine approaches another component of the machine. The increase in capacitance may be detected in order to identify a potential rub condition.

The method 300 may end following block 325.

The operations described in the method 300 of FIG. 3 do not necessarily have to be performed in the order set forth in FIG. 3, but instead may be performed in any suitable order. Additionally, in certain embodiments of the invention, more or less than all of the elements or operations set forth in FIG. 3 may be performed.

FIG. 4 is a diagram illustrating one example of a change in the capacitance associated with a rotating component of a turbine during a potential rub condition and during a rub condition, according to an illustrative embodiment of the invention. FIG. 4 shows a plot 400 representative of an example variance in capacitance associated with a rubbing condition between a rotating component, such as a rotor, and another component of a turbine, such as a stator. In the plot 400, the horizontal axis may represent a distance of the rotor from the stator normalized with respect to the rotor center, while the vertical axis may represent the capacitance at various distances of the rotor from the stator. The capacitance values are shown as multiples of the capacitance for when the rotor is centered. FIG. 4 shows the capacitance values to be fairly constant over almost the entire distance from the rotor to the stator, except for a small range of distance near the stator, where the plot 400 shows a relatively steep climb or increase in capacitance. A potential rub condition may be detected when the capacitance rises above a threshold value. The trend in the capacitance values in plot 400 indicates that the capacitance between the rotor and the stator may increase as the rotor approaches the stator. Specifically, during a period of time immediately prior to a rub condition, the capacitance may increase relatively quickly. A potential rub condition may be detected based on identifying this increase in capacitance in real time or near real time during the operation of the turbine. In this regard, a rub condition may be prevented by identifying a potential rub condition and taking an appropriate preventive action, such as, shutting down the turbine, decreasing the load in the turbine, etc. Although, the variation in capacitance for any component of a machine may not exactly replicate the trend shown in FIG. 4, the change in capacitance between any two components of a machine in a potential rub condition may be similar.

FIG. 5 is a diagram illustrating one example of a change in the resistance and capacitance associated with a rotating component of a turbine during a potential rub condition and during a rub condition, according to an illustrative embodiment of the invention. FIG. 5 shows a plot 500 representative of an example variance in capacitance and resistance associated with a rub condition or a potential rub condition between a rotating component, such as a rotor, and another component of a turbine, such as a stator. In the plot 500, the horizontal axis may represent time, while the vertical axis may represent the normalized values of capacitance and resistance at various instants of time. At initial time, rotor is centered with respect to stator. The plot 500 shows that as we move away from the origin of the axes with time, the rotor moves towards the stator. The rotor subsequently rubs the stator after a first range in time. After a second range in time, the rotor moves away from the stator, and moves towards the centered position for a third range in time. Thus, the final time indicates the time at which the rotor is again centered with respect to the stator. As shown in the plot 500, the resistance and capacitance values remain almost constant all throughout until the rotor approaches the stator. The capacitance values show a relatively steep climb just prior to rub, while the resistance values show a relatively dramatic decrease in the region near the stator, and approach near zero values in the second range in time when the rotor rubs against the stator. Thus based on at least one of the capacitance or the resistance values, or a combination thereof, a rub condition and/or a potential rub condition may be identified. Additionally, severity associated with a rub condition may be determined based at least in part of on the length of time for which the resistance values approach near zero values. Thus, the length of the second range in time for which the rotor rubs the stator partly determines the severity associated with the rubbing. Though the variation in capacitance and/or resistance between any two components of a machine may not exactly replicate the trend shown by the rotating component of the turbine in FIG. 4, the change in capacitance and/or resistance between any two components in a potential rub condition may be similar.

Embodiments of the invention may be applicable for any device that includes one or more electrically conductive components that may contact one or more other components of the device. Some examples of such devices include but are not limited to compressors, gas turbines, steam turbines etc. The invention may be broadly applicable to any device which includes a plurality of components that may come in contact with each other. It will be apparent that any example taken provided in the foregoing specification is merely provided for explanation purposes and does not limit the scope of the invention by any means.

The technical effect of embodiments of the invention is to monitor a machine, such as a turbine and determine or otherwise identify rub conditions or potential rub conditions within the machine. Various software components and/or algorithms may be utilized in embodiments of the invention in order to identify rub conditions and/or potential rub conditions.

This written description uses examples to disclose the invention, including the best mode, and also to enable any person skilled in the art to practice the invention, including making and using any devices or systems and performing any incorporated methods. The patentable scope the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for monitoring a machine, the method comprising:
    providing an electrical signal for transmission to and into a component of the machine;
    monitoring a capacitance associated with the electrical signal in the component;
    determining an increase in the monitored capacitance as the component of the machine moves towards another component of the machine;
    determining that the increase in the monitored capacitance exceeds a threshold value;
    detecting a potential rub condition for the component of the machine based at least in part on the determination that the increase in the monitored capacitance exceeds the threshold value; and
    determining a severity associated with the potential rub condition based at least in part on a length of time for which the increase in the monitored capacitance exceeds the threshold value.

2. The method of claim 1, wherein the machine comprises a turbine.

3. The method of claim 1, wherein the electrical signal comprises an alternating current voltage signal comprising a voltage of approximately one to approximately two volts.

4. The method of claim 1, further comprising:
    monitoring an impedance associated with the electrical signal, and detecting a rub condition based at least in part on determining a decrease in the monitored impedance.

5. The method of claim 4, further comprising determining a severity associated with the detected rub condition based at least in part on a length of time for which the monitored impedance falls outside of an expected range of impedance values.

6. The method of claim 1, wherein the electrical signal comprises an electrical signal with a frequency of approximately one kilohertz to approximately 50 kilohertz.

7. The method of claim 1, wherein monitoring the electrical signal in the component of the machine comprises monitoring the component for an electrical signal having a frequency that is within a predetermined frequency range.

8. A system for monitoring a machine, the system comprising:
    a signal generator configured to provide an electrical signal that is transmitted to and into at least one component of the machine;
    one or more detection devices configured to detect a capacitance associated with the electrical signal in the at least one component; and
    at least one processor configured to:
        detect an increase in the capacitance as the component of the machine moves toward another component of the machine;
        determine that the increase in the capacitance exceeds a threshold value;
        detect, based at least in part on the determination that the increase in the capacitance exceeds the threshold value comparison, the occurrence of a potential rub condition for the component; and
        determining a severity associated with the potential rub condition based at least in part on a length of time for which the increase in capacitance exceeds the threshold value.

9. The system of claim 8, wherein the machine comprises a turbine.

10. The system of claim 8, wherein the electrical signal comprises an alternating current voltage signal comprising a voltage of approximately one to approximately two volts.

11. The system of claim 8, wherein the at least one processor is further configured to:
    monitor an impedance associated with the electrical signal; and
    detect the occurrence of a rub condition based at least in part on detecting a decrease in the monitored impedance.

12. The system of claim 8, wherein the at least one processor is further configured to determine a severity associated with the detected rub condition based at least in part on a length of time for which the monitored impedance falls outside of an expected range of impedance values.

13. The system of claim 8, wherein the electrical signal comprises an electrical signal with a frequency of approximately one kilohertz to approximately 50 kilohertz.

14. The system of claim 8, wherein the one or more detection devices are operable to detect electrical signals that fall within a predetermined frequency range.

15. A method for monitoring a machine, the method comprising:
    transmitting an alternating current voltage signal to and into at least one component of the machine;
    monitoring a capacitance associated with the signal;

detecting an increase in the monitored capacitance as the component of the machine moves towards another component of the machine;

determining that the increase in the monitored capacitance exceeds a threshold value;

detecting, based at least in part on the determination that the increase in the monitored capacitance exceeds the threshold value, the occurrence of a potential rub condition for the component; and determining a severity associated with the potential rub condition based at least in part on a length of time for which the increase in the capacitance exceeds the threshold value.

16. The method of claim 15, wherein the alternating current voltage signal comprises a voltage of approximately one to approximately two volts.

17. The method of claim 15, further comprising:

monitoring an impedance associated with the signal, and detecting a rub condition based at least in part on determining a decrease in the monitored impedance.

18. The method of claim 15, further comprising determining a severity associated with the identified rub condition based at least in part on a length of time for which the determined impedance falls outside of an expected range of impedance values.

* * * * *

UNITED STATES PATENT AND TRADEMARK OFFICE
CERTIFICATE OF CORRECTION

Page 1 of 1

PATENT NO. : 8,884,628 B2
APPLICATION NO. : 13/343821
DATED : November 11, 2014
INVENTOR(S) : Franklin It is certified that error appears in the above-identified patent and that said Letters Patent is hereby corrected as shown below:

In the Specification

In Column 1, Line 26, delete "caging," and insert -- casing, --, therefor.

In Column 5, Line 22, delete "nib" and insert -- rub --, therefor.

In Column 6, Line 45, delete "nib" and insert -- rub --, therefor.

Signed and Sealed this
Ninth Day of June, 2015

Michelle K. Lee
*Director of the United States Patent and Trademark Office*